United States Patent
Gardner et al.

(12) 
(10) Patent No.: US 6,197,647 B1
(45) Date of Patent: *Mar. 6, 2001

(54) METHOD OF FORMING ULTRA-THIN OXIDES WITH LOW TEMPERATURE OXIDATION

(75) Inventors: Mark I. Gardner, Cedar Creek; Mark C. Gilmer, Austin, both of TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/198,195

(22) Filed: Nov. 23, 1998

Related U.S. Application Data

(63) Continuation of application No. 08/785,355, filed on Jan. 17, 1997, now Pat. No. 5,877,057.

(51) Int. Cl.$^7$ .................................................. H01L 21/336
(52) U.S. Cl. ........................................... 438/301; 438/772
(58) Field of Search .................................... 438/301, 303, 438/305, 770, 772

(56) References Cited

U.S. PATENT DOCUMENTS

| | | |
|---|---|---|
| 4,776,925 | 10/1988 | Fossum et al. . |
| 4,897,368 | 1/1990 | Kobushi et al. . |
| 4,914,046 | 4/1990 | Tobin et al. . |
| 5,296,411 | 3/1994 | Gardner et al. . |
| 5,316,981 | 5/1994 | Gardner et al. . |
| 5,330,935 | 7/1994 | Dobuzinsky et al. . |
| 5,332,692 | 7/1994 | Saitoh . |
| 5,350,698 | 9/1994 | Huang et al. . |
| 5,360,769 | 11/1994 | Thakur et al. . |
| 5,393,676 | 2/1995 | Anjum et al. . |

(List continued on next page.)

OTHER PUBLICATIONS

Wolf, Stanley, Ph.D., *Silicon Processing for the VLSI Era, vol. 1: Process Technology*, 1986, p. 183.

Wolf, Stanley, Ph.D., *Silicon Processing for the VLSI Era, vol. 3: The Submicron Mosfet*, 1995, p. 438.

*Primary Examiner*—Richard Booth
(74) *Attorney, Agent, or Firm*—Conley, Rose & Tayon, PC; Robert C. Kowert; Kevin L. Doffer

(57) ABSTRACT

A semiconductor process in which a low temperature oxidation of a semiconductor substrate upper surface followed by an in situ deposition of polysilicon are used to create a thin oxide MOS structure. Preliminarily, the upper surface of a semiconductor substrate is cleaned, preferably with a standard RCA clean procedure. A gate dielectric layer is then formed on the upper surface of the substrate. A first polysilicon layer is then in situ deposited on the gate dielectric layer. An upper portion of the first polysilicon layer is then oxidized and the oxidized portion is thereafter removed from the upper surface of the first polysilicon layer. A second polysilicon layer is subsequently deposited upon the first polysilicon layer. Preferably, the formation of the gate dielectric on the semiconductor substrate upper surface comprises annealing the semiconductor substrate in an ambient comprising an inert species and $O_2$. The ambient temperature of the first oxidation chamber is preferably maintained at a temperature less than approximately 300° C. during the formation of the gate dielectric. The first polysilicon layer, in the preferred embodiment, is deposited in situ such that the semiconductor substrate remains within the first oxidation chamber during the deposition of the first polysilicon layer. The oxidation of an upper portion of the first polysilicon layer is preferably accomplished in a nitrogen bearing ambient so that nitrogen is introduced into the first polysilicon layer to inhibit the penetration of mobile impurities across the gate dielectric into the channel region of the transistor and enhance the device properties.

24 Claims, 2 Drawing Sheets

U.S. PATENT DOCUMENTS

| | | |
|---|---|---|
| 5,397,720 | 3/1995 | Kwong et al. . |
| 5,468,974 | 11/1995 | Aronowitz et al. . |
| 5,538,923 | 7/1996 | Gardner et al. . |
| 5,541,141 | 7/1996 | Cho . |
| 5,563,095 * | 10/1996 | Frey . |
| 5,567,638 | 10/1996 | Lin et al. . |
| 5,633,177 | 5/1997 | Anjum . |
| 5,652,166 | 7/1997 | Sun et al. . |
| 5,674,788 | 10/1997 | Wristers et al. . |
| 5,700,699 | 12/1997 | Han et al. . |
| 5,891,793 * | 4/1999 | Gardner et al. ............... 438/585 |
| 5,891,809 * | 4/1999 | Chau et al. ............... 438/770 |

\* cited by examiner

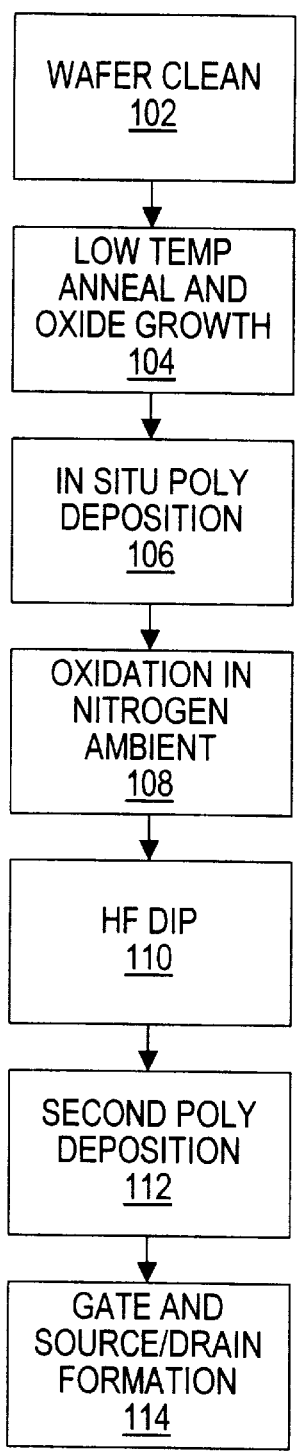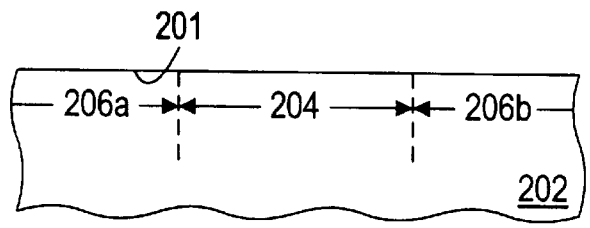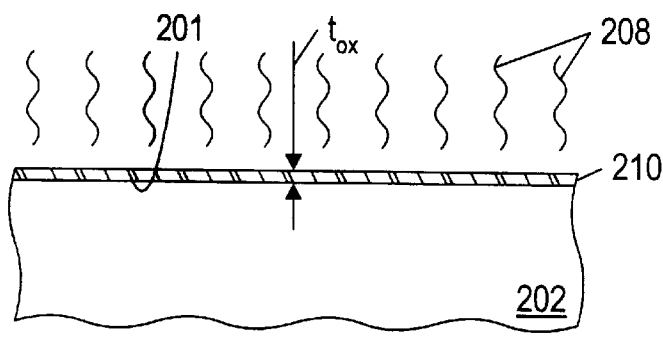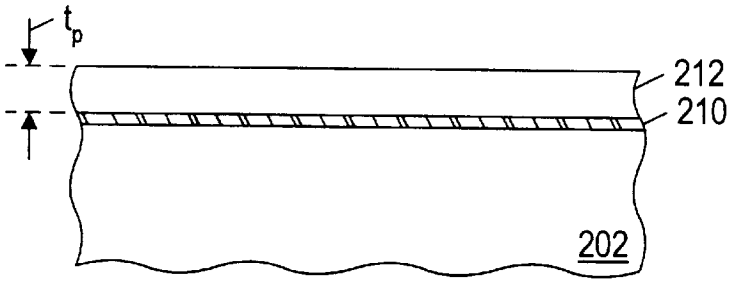

METHOD OF FORMING ULTRA-THIN OXIDES WITH LOW TEMPERATURE OXIDATION

This application is a cotinuation of U.S. Ser. No. 08/785,355, filed Jan. 17, 1997, now U.S. Pat. No. 5,877,057.

BACKGROUND OF THE INVENTION

1. Field of the Invention

This invention relates to semiconductor fabrication and more particularly to a method of forming a thin gate oxide using a low temperature oxidation followed by an in situ deposition of polysilicon.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 microns, the limitations of conventional transistor processing become more apparent. To combat short channel effects in deep sub-micron transistors, the depth of the source/drain junctions and the thickness of the gate oxides must be reduced. Devices become more susceptible, however, to diffusion of electrically active impurities located in the conductive gate structure across the gate oxide and into the active area of the transistor as the gate oxide thickness decreases below 50 angstroms. The presence of these impurities within the channel region can undesirably alter the threshold voltage of the device. This problem is especially acute for boron implanted gate structures. In addition, thinner oxides increase concerns about hot carrier damage and oxide breakdown due, in part, to increased electrical fields within the transistor channel and across the gate dielectric. With respect to the latter, a 3 volt bias applied across a 50 angstrom gate oxide of an MOS transistor results in an electrical field of $6 \times 10^6$ V/cm, which is considered to be an upper limit on the electrical field sustainable by a thermally formed $SiO_2$ film. See, e.g., 1 S. Wolf & R. Tauber, *Silicon Processing for the VLSI Era* 183 (Lattice Press 1986) [hereinafter "Wolf Vol. 1"]. Moreover, "cold" carrier tunneling becomes significant in gate dielectrics thinner than approximately 60 angstroms and, because of these tunneling effects, 30 angstroms has been reported as a lower limit for gate oxide thickness. See 3 S. Wolf, *Silicon Processing for the VLSI* Era438 (Lattice Press 1995) [hereinafter "Wolf Vol. 3"].

In addition to reliability concerns, thin oxides present significant manufacturing challenges as well. The uniformity of the gate dielectric film across the wafer becomes more critical as the film thickness decreases. A 5 angstroms variation in film thickness across a wafer is far more significant in a 50 angstrom film than a 150 angstrom film. Greater control over oxide growth rates and uniformity are needed to insure that the thinner dielectric can be consistently reproduced in a manufacturing environment.

Despite the numerous problems noted, thin gate dielectrics are desirable because the transistor drive current is inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit. Nitrogen bearing gate dielectrics including oxynitride gate dielectrics have been used to enhance the quality of thin (i.e., less than 100 angstroms) gate oxides and to reduce boron penetration. In Kwong (U.S. Pat. No. 5,397,720), for example, a method of forming an oxynitride gate electric is disclosed. The Kwong method consists essentially of growing an oxynitride layer in an $N_2O$ ambient and thereafter increasing the nitrogen concentration within the dielectric by introducing heated $NH_3$. Similarly, in Cho (U.S. Pat. No. 5,541,141), an oxynitride gate dielectric is grown with a 3-stage process. During the first and third phases, an $N_2O$ ambient is used. During the second phase, $NH_3$ is added to the $N_2O$ mixture to control the oxidation rate and the influx of nitrogen to the oxynitride film. While approaches such as those of Kwong and Cho address some of the reliability issues associated with thin oxides, they do not address the manufacturing variability that prevents the consistent reproduction of high quality, ultra thin dielectric films.

Therefore, it would be highly desirable to fabricate ultra-thin MOS gate dielectrics that exhibited resistance to penetration of mobile carriers such as boron and improved quality characteristics over conventionally formed gate dielectrics with a consistently reproducible and manufacturable process.

SUMMARY OF THE INVENTION

The problems identified above are in large part addressed by a semiconductor process in which a low temperature oxidation of a semiconductor substrate upper surface is used to create a thin oxide followed by in situ deposition of polysilicon. The low temperature oxidation in combination with the in situ deposition of polysilicon is capable of advantageously producing an extremely thin gate dielectric having a thickness in the range of approximately 5 to 15 angstroms. Nitrogen is preferably incorporated into the polysilicon to serve as a barrier to migrating impurities.

Broadly speaking, the present invention contemplates a semiconductor process in which a semiconductor substrate is provided. Preferably, the semiconductor substrate includes a p-type epitaxial layer formed on a p+ silicon bulk. Preliminarily, the upper surface of the semiconductor substrate is cleaned, preferably with a standard RCA clean procedure. A gate dielectric layer is then formed on the upper surface of the semiconductor substrate. The formation of the gate dielectric occurs in a first oxidation chamber. A first polysilicon layer is then formed on the gate dielectric layer. The formation of the first polysilicon layer, in the presently preferred embodiment, is accomplished in situ following the formation of the gate dielectric layer. An upper portion of the first polysilicon layer is then oxidized and the oxidized portion is thereafter removed from the upper surface of the first polysilicon layer. A second polysilicon layer is subsequently deposited upon the first polysilicon layer.

In a preferred embodiment, the process further includes the steps of forming a polysilicon gate structure using conventional mask and etch techniques and forming a pair of source/drain structures in an upper region of the semiconductor substrate. The source/drain structures are laterally displaced on either side of a channel region of the semiconductor substrate. The channel region is aligned with the polysilicon gate structure. In one embodiment, the cleaning of the semiconductor substrate upper surface includes the steps of immersing the semiconductor substrate in a solution of $H_2O$, $NH_4OH$, and $H_2O_2$ maintained at a temperature in the range of approximately 65° to 80° C. for a duration of approximately 5 to 15 minutes and thereafter immersing the semiconductor substrate into a second solution. The second solution includes $H_2O$, HCl, and $H_2O_2$ maintained at a temperature in the range of approximately 65° to 80° C. for a duration of approximately 5 to 15 minutes. Preferably, the formation of the gate dielectric on the semiconductor substrate upper surface comprises annealing the semiconductor substrate in an ambient comprising an inert species and $O_2$. The ambient temperature of the first oxidation chamber is preferably maintained at a temperature less than approximately 300° C. during the formation of the gate dielectric. The first polysilicon layer, in the preferred embodiment, is deposited in situ such that the semiconductor substrate remains within the first oxidation chamber during the deposition of the first polysilicon layer. The oxidation of an upper portion of the first polysilicon layer is preferably accomplished in a nitrogen bearing ambient so that nitrogen is introduced into the first polysilicon layer to inhibit the penetration of mobile impurities across the gate dielectric into the channel region of the transistor. The nitrogen bearing ambient during the oxidation of the first polysilicon layer preferably includes NO, $N_2O$, or $NH_3$. The oxidized portion of the first polysilicon layer is preferably removed by dipping the semiconductor substrate into an $H_2O$:HF solution maintained at an approximate concentration of 10:1.

The present invention further contemplates a transistor including a semiconductor substrate. The semiconductor substrate includes a channel region which is laterally displaced between a first source/drain region and a second source/drain region. The gate dielectric is formed on an upper surface of the semiconductor substrate and a conductive gate structure is formed on an upper surface of the gate dielectric. The conductive gate structure includes a second polysilicon layer formed on a first polysilicon layer. The conductive gate structure is aligned over the channel region of the semiconductor substrate. The transistor further includes a first and second source/drain structures formed within the semiconductor substrate laterally displaced on either side of the channel region.

The semiconductor substrate, in a preferred embodiment, includes a p-type epitaxial layer formed on a p+ silicon bulk. A resistivity of the epitaxial layer is ideally in the range of approximately 10 to 15 Ω-cm. In a presently preferred embodiment, the gate dielectric is an oxide and has a thickness in the range of approximately 5 to 15 angstroms. In one embodiment, the first polysilicon layer includes a nitrogen bearing impurity distribution. A thickness of the first polysilicon layer is suitably in the range of approximately 50 to 500 angstroms. The first and second source/drain structures preferably include an impurity distribution of phosphorous, arsenic or boron.

The present invention still further contemplates a method of forming a transistor. A semiconductor substrate is provided and a dielectric layer is grown on an upper surface of the semiconductor substrate. The dielectric layer growth is accomplished in an ambient maintained at a temperature less than approximately 300° C. A first polysilicon layer is then deposited on the gate dielectric layer. An upper portion of the first polysilicon layer is then oxidized and the oxidized portion is removed from the first polysilicon layer. A second polysilicon layer is then deposited on the first polysilicon layer and first and second source/drain structures are formed within the first and second source/drain regions of the semiconductor substrate. A thickness of the dielectric layer is preferably in the range of approximately 5 to 15 angstroms. A thickness of the first polysilicon layer is preferably in the range of approximately 50 to 500 angstroms. The oxidation of the upper portion of the first polysilicon layer occurs in a nitrogen bearing ambient such that the first polysilicon layer includes a nitrogen distribution. The removal of the oxidized upper portion of the first polysilicon layer is preferably accomplished by dipping the semiconductor substrate into an $H_2O$:HF solution maintained at an approximate concentration of 10:1.

BRIEF DESCRIPTION OF THE DRAWINGS

Other objects and advantages of the invention will become apparent upon reading the following detailed description and upon reference to the accompanying drawings in which:

FIG. 1 is a flow diagram of a semiconductor process for forming an MOS transistor;

Figure 2D:
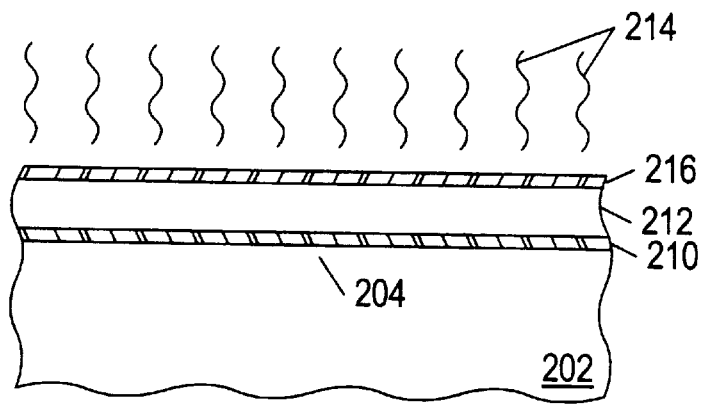
FIG. 2d is a processing step subsequent to FIG. 2c in which an upper portion of the first polysilicon layer is oxidized.

While the invention is susceptible to various modifications and alternative forms, the specific embodiments hereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 is a flow diagram of a semiconductor process according to the present invention. A semiconductor substrate, preferably a single crystal silicon wafer, is provided and an upper surface of the semiconductor substrate is cleaned with an RCA clean. In a typical RCA clean, the semiconductor substrate is immersed in a solution of $H_2O$—$NH_4OH$—$H_2O_2$ in an approximate ratio of 5:1:1 by volume. The solution is maintained at a preferred temperature of approximately 65° to 80° C. After approximately 5 to 15 minutes in the solution, the semiconductor substrate is removed from the solution and rinsed in deionized water. Typically, the semiconductor substrate is then immersed for approximately 15 seconds in a 10:1 HF solution to remove any oxide formed during the first step. Next, the wafer is immersed in a solution of $H_2OHCl$—$H_2O_2$ in an approximate ratio of 6:1:1 by volume heated to approximately 650 to 800 C. After approximately 5 to 15 minutes in the HCl solution, the semiconductor substrate is rinsed and dried. A typical RCA clean is described in Wolf Vol. 1 at 516–17. After wafer clean 102, a thin gate dielectric is formed on an upper surface of the semiconductor substrate in process step 104. In the preferred embodiment, process step 104 is accomplished by immersing the semiconductor substrate into an oxidation chamber maintained at an ambient temperature less than approximately 300° C. The oxidation chamber can be a conventional furnace to or a rapid thermal apparatus chamber. The oxidation chamber primarily comprises an ultra pure (i. e., purity greater than approximately 99%) inert species such as nitrogen or argon combined with a dilute mixture of $O_2$. Preferably, the $O_2$ concentration in the oxidation chamber during oxide growth 104 is less than approximately 3% by volume. By keeping the $O_2$ concentration in the oxidation chamber below 3% and the ambient temperature less than 300° C., an extremely thin oxide can be controllably formed upon the upper surface of the semiconductor substrate. Ideally, a gate oxide layer having a thickness of approximately 5 to 15 angstroms is formed in less than approximately 1 hour. An optional post growth anneal cycle, in which oxygen is purged from the chamber and the chamber is filled with an inert species and the temperature is raised to approximately 300° to 600° C.

In process step 106, a first polysilicon layer is formed on the gate dielectric layer. To prevent any unwanted oxidation subsequent to process step 104, process step 106 is preferably accomplished in situ. For purposes of this disclosure, in situ processing refers to performing sequential processing steps in the same processing apparatus such that the semiconductor substrate is not exposed to the external atmosphere between the processing steps. Process step 106, in a presently preferred embodiment, can be carried out in situ by purging the oxidation chamber of oxygen and subsequently depositing polysilicon by thermally decomposing silane in a temperature range of approximately 580° to 650° C. using a chamber pressure of less than approximately two torrs. In the presently preferred embodiment, process step 106 forms a first polysilicon layer with a thickness in the approximate range of 50 to 500 angstroms. Next, an upper portion of the first polysilicon layer is oxidized in process step 108. Process step 108 is suitably accomplished by immersing the semiconductor substrate into a chamber that includes a nitrogen bearing species and oxygen. The chamber is maintained at a temperature of approximately 300° to 600° C. such that an upper portion of the polysilicon layer is thermally oxidized. Suitable nitrogen bearing species include NO, $N_2O$, $NH_3$ or any other nitrogen bearing element. By oxidizing the first polysilicon layer in a nitrogen containing ambient, nitrogen is introduced into the first polysilicon layer to desirably provide a barrier against mobile and electrically active carriers from penetrating across the gate dielectric into the gate region of the transistor.

In process step 110, the oxidized portion of the first polysilicon layer is removed preferably by dipping the semiconductor substrate into a 10:1 HF solution. Thereafter a second polysilicon layer is deposited, in process step 112, on the first polysilicon layer. The second polysilicon layer increases the total thickness of the polysilicon film which includes the first polysilicon layer and the second polysilicon layer. In a manner similar to the deposition of the first polysilicon layer, second polysilicon layer is deposited with a low pressure (i. e., less than two torrs) CVD process at a temperature less than approximately 650° C. The first and second polysilicon layers combine to form a conductive gate layer. In process step 114, the conductive gate layer is patterned to form a conductive gate structure and thereafter, source/drain structures are formed within source/drain region within the semiconductor substrate. The patterning of the conductive gate layer to form the conductive gate structure is accomplished with conventional photolithography and etch techniques. The formation of the source/drain structures is preferably achieved with ion implantation of impurities such as boron, phosphorous, or arsenic. In the preferred embodiment, the source/drain structures include a lightly doped impurity distribution contained within a lightly doped region and a more heavily doped source/drain impurity distribution contained within a heavily doped region.

Turning now to FIGS. 2a through 2g, a processing sequence for forming a semiconductor transistor according to the present invention is shown. In FIG. 2a, a semiconductor substrate 202 is provided. In the preferred embodiment, semiconductor substrate 202 is single crystal silicon. Ideally, semiconductor substrate includes a p-type epitaxial layer having a resistivity of approximately 10 to 15 $\Omega$-cm formed on a p+ silicon bulk (for purposes of this disclosure, a p+ or n+ designation indicates a doping concentration in excess of $10^{19}$ atoms/cm$^3$). Semiconductor substrate 202 includes channel region 204 laterally displaced between first source/drain region 206a and second source/drain region 206b. Turning to FIG. 2b, gate dielectric 210 is formed on upper surface 201 of semiconductor substrate 202. In the preferred embodiment, the formation of gate dielectric 210 is achieved by immersing semiconductor substrate 202 into a first oxidation chamber containing ambient 208. Ambient 208, in the presently preferred embodiment, primarily comprises an ultra pure inert species such as nitrogen or argon. Ambient 208 further includes a dilute concentration of $O_2$. The preferred concentration of $O_2$ in ambient 208 is less than approximately 3% by volume. Ambient 208 is maintained, in the presently preferred embodiment, at a temperature less than approximately 300° C. The combination of the relatively low oxidation temperature and the low concentration of $O_2$ in ambient 208 results in an oxidation process that can repeatedly produce an oxide film having a thickness in the range of approximately 5 to 15 angstroms and has an oxidation time that is typically less than approximately 1 hour.

Turning now to FIG. 2c, first polysilicon layer 212 is formed upon an upper surface of gate dielectric 210. To prevent unwanted oxidation subsequent to the oxidation described with respect to FIG. 2b, first polysilicon layer 212 is deposited in situ following the formation of the gate dielectric layer 210. The in situ deposition of first polysilicon layer 212 is preferred because the exposure of semiconductor substrate 202 to atmosphere prior to the deposition of first polysilicon layer 212 may result in the unwanted formation of a monolayer or more of oxide upon gate dielectric 210. Accordingly, first polysilicon layer 212 is deposited upon gate dielectric 210 preferably without removing semiconductor substrate 202 to the atmosphere. Ideally, the in situ deposition of first polysilicon layer 212 is accomplished by purging the first oxidation chamber of oxygen and thereafter thermally decomposing silane at a temperature less than approximately 650° C. and at a temperature less than two torrs. The thickness $t_p$ of first polysilicon layer 212 is in the range to approximately 50 to 500 angstroms.

Turning to FIG. 2d, an upper portion 216 of first polysilicon layer 212 is oxidized in ambient 214 such that upper portion 216 comprises an oxide. In the preferred embodiment ambient 214 includes a nitrogen bearing species and oxygen. Suitable nitrogen bearing species include NO, $N_2O$, $NH_3$, or any other nitrogen bearing species. Ambient 214 is preferably maintained at temperature in the range of approximately 300° to 1000° C. during the oxidation of upper portion 216 of first polysilicon layer 212. The presence of nitrogen within ambient 214 ensures that nitrogen is introduce into first polysilicon layer 212 during the oxidation process. The presence of nitrogen layer within first polysilicon layer 212 beneficially provides a barrier to mobile impurities thereby preventing the migration of electrically active impurities into channel region 204 of semiconductor substrate 202. The unwanted presence of electrically active impurities within channel region 204 can result in an unintended threshold shift that can negatively affect the operating characteristics of the integrated circuit.

Figure 2E:
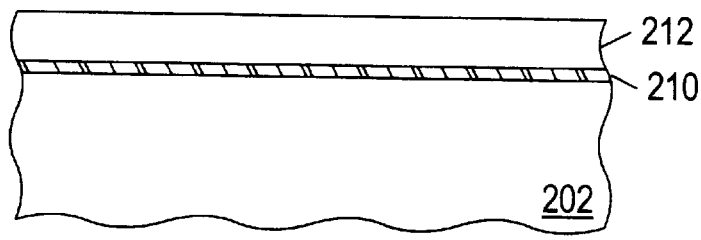
FIG. 2e is a processing step subsequent to FIG. 2d in which the oxidized upper portion is removed from the first polysilicon layer.
Figure 2F:
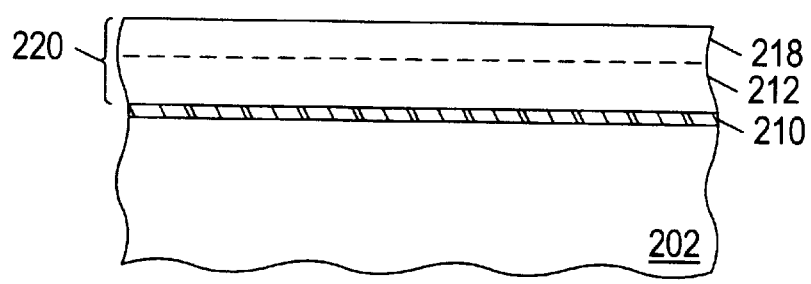
FIG. 2f is a processing step subsequent to FIG. 2e in which a second polysilicon layer is deposited upon the first polysilicon layer; and, FIG. 2g is a processing step subsequent to FIG. 2f in which a conductive gate structure and a pair of source/drain structures have been formed.

Turning to FIG. 2e, the oxidized upper portion 216 of first polysilicon layer 212 is removed. The removal of oxidized portion 216 is preferably accomplished by dipping semiconductor substrate into a 10:1 HF solution for a duration of approximately 1 to 15 minutes. In FIG. 2f, second polysilicon layer 218 is deposited upon first polysilicon layer 212 to form conductive layer 220. The deposition of second polysilicon layer 218 is suitably accomplished using a low pressure (i.e., less than two torrs) CVD process at a temperature of less than approximately 650°. Second polysilicon layer 218 adds needed thickness to conductive layer 220 and provides a substantially nitrogen free region of conductive layer 220. A nitrogen free polysilicon zone is believed to exhibit higher conductivity and may thus be desirable in reducing the overall resistivity of the conductive gate structure. However, $N_2$ at the polysilicon-oxide interface is desirable for optimum transistor properties.

Figure 2G:
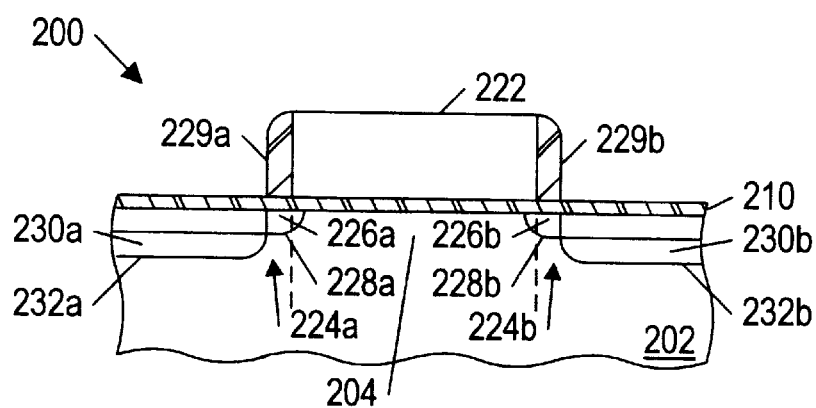
FIG. 2a is a partial cross-sectional view of a semiconductor substrate including a channel region displaced between a pair of source/drain regions.
FIG. 2b is processing step subsequent to FIG. 2a in which a gate dielectric layer is formed on the semiconductor substrate.
FIG. 2c is processing step subsequent to FIG. 2b in which a first polysilicon layer is deposited upon the gate dielectric layer.

Turning to FIG. 2g, a transistor 200 according to the present invention is shown. Conductive gate layer 220 (shown in FIG. 2f) is patterned to form a conductive gate structure 222 that is aligned over channel region 204 of semiconductor substrate 202. After the formation of conductive gate 222, first source/drain structure 224a and second source/drain structure 224b are formed within respective source/drain regions 206a and 206b of semiconductor substrate 202. In the embodiment shown in FIG. 2g, first source/drain structure 224a and second source/drain structure 224b (collectively referred to as source/drain structures 224) include lightly doped impurity distributions 226 substantially contained within lightly doped impurity regions 228 and heavily doped impurity distributions 230 substantially contained within heavily doped source/drain regions 232. In one embodiment, lightly doped impurity distributions 226 have a peak impurity concentration less than approximately $1 \times 10^{17}$ atoms/cm³ whereas heavily doped impurity distributions 230 have peak impurity concentrations in excess of $1 \times 10^{19}$ atoms/cm³. As will be appreciated by those skilled in the art, both lightly doped impurity distribution 226 and heavily doped impurity distribution 230 typically include implanted atoms of boron, phosphorous, or arsenic. Consistent with the presence of lightly doped source/drain regions, transistor 200 further includes a first spacer structure 229a and a second spacer structure 229b formed on respective sidewalls of conductive gate 222. The formation of spacer structures 229 is typically accomplished by depositing a conformal CVD dielectric and thereafter performing an anisotropic etch process carried out with a minimal overetch to deliberately leave behind the spacer structures as shown in FIG. 2g. Transistor 200 further includes gate dielectric 210 as described with respect to FIG. 2b and semiconductor substrate 202 as described with respect to FIG. 2a.

It will be appreciated to those skilled in the art that the present invention contemplates a method of forming a semiconductor transistor with an ultra thin gate dielectric. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A semiconductor process, comprising:

forming a gate dielectric layer on an upper surface of a semiconductor substrate in a first oxidation chamber, wherein said first oxidation chamber is maintained at an ambient temperature less than approximately 300° C. and wherein a concentration of $O_2$ in said first oxidation chamber is less than approximately 3% by volume; and forming a first polysilicon layer on said gate dielectric layer in situ with said forming a gate dielectric.

2. The process of claim 1, further comprising:

forming a polysilicon gate structure wherein said polysilicon gate structure is aligned over a channel region of said semiconductor substrate; and forming a pair of source/drain structures in an upper region of said semiconductor substrate, wherein said source/drain structures are laterally displaced on either side of said channel region.

3. The process of claim 1, wherein said semiconductor substrate comprises a p-type epitaxial layer formed on a p+ silicon bulk.

4. The process of claim 1, further comprising cleaning said upper surface of said semiconductor substrate prior to said forming a gate dielectric layer, wherein said cleaning comprises:

immersing said semiconductor substrate in a solution comprising $H_2O$, $NH_4OH$, and $H_2O_2$ maintained at a temperature between approximately 65° and 85° C. for a duration of approximately 5 to 15 minutes; and immersing said semiconductor substrate in a solution comprising $H_2O$, HCl, and $H_2O_2$ maintained at temperature in the range of approximately 65° to 85° C. for a duration of approximately 5 to 15 minutes.

5. The process of claim 1, wherein said forming a gate dielectric layer on said upper surface comprises annealing said semiconductor substrate in said first oxidation chamber wherein said first oxidation chamber comprises an inert species and $O_2$.

6. The process of claim 1, further comprising:

oxidizing an upper portion of said first polysilicon layer;

removing an oxidized portion from said upper surface of said first polysilicon layer; and depositing a second polysilicon layer upon said first polysilicon layer.

7. The process of claim 6, wherein said oxidizing is accomplished in a nitrogen bearing ambient to introduce nitrogen into said first polysilicon layer.

8. The process of claim 7, wherein said nitrogen bearing ambient includes a nitrogen species selected from the group consisting of NO, $N_2O$, and $NH_3$.

9. The process of claim 6, wherein said removing an oxidized portion comprises dipping said semiconductor substrate in an $H_2O$:HF solution maintained at an approximate concentration of 10:1.

10. The process of claim 1, further comprising purging said first oxidation chamber of oxygen prior to said forming a first polysilicon layer.

11. The process of claim 1, further comprising annealing said semiconductor substrate after said forming a gate dielectric layer and prior to said forming a first polysilicon layer, wherein said annealing is performed in said first oxidation chamber at a temperature approximately 300–600° C.

12. The process of claim 11, wherein said annealing comprises purging said first oxidation chamber of oxygen.

13. The process of claim 1, wherein during said forming a gate dielectric, said first oxidation chamber primarily comprises $O_2$ and an inert species selected from the group of nitrogen or argon.

14. The process of claim 1, wherein said gate dielectric layer is formed in less than approximately 1 hour.

15. A method of forming a transistor, comprising:
   growing a dielectric layer on an upper surface of a semiconductor substrate, wherein said growing is accomplished in an ambient maintained at a temperature less than approximately 300° C. and wherein a thickness of said dielectric layer is in the range of approximately 5 to 15 angstroms; and
   depositing a first polysilicon layer on said dielectric layer, wherein said growing and said depositing a first polysilicon layer are performed in situ.

16. The method of claim 15 wherein said semiconductor substrate includes a 10 to 15 Ω-cm p-type epitaxial layer formed over a p+ silicon bulk.

17. The method of claim 15 wherein a thickness of said first polysilicon layer is in the range of approximately 50 to 500 angstroms.

18. The method of claim 15, further comprising:
   oxidizing an upper portion of said first polysilicon layer;
   removing an oxidized upper portion from said first polysilicon layer;
   depositing a second polysilicon layer on said first polysilicon layer; and
   forming first and second source/drain structures within said first and second source/drain regions respectively of said semiconductor substrate.

19. The method of claim 18 wherein said oxidizing said upper portion of said first polysilicon layer occurs in a nitrogen bearing ambient such that said first polysilicon layer includes a nitrogen distribution.

20. The method of claim 18 wherein said removing said oxidized upper portion comprises dipping said semiconductor substrate into an $H_2O$:HF solution maintained at an approximate concentration of approximately 10:1.

21. The process of claim 15, further comprising annealing said semiconductor substrate after said growing a dielectric layer and prior to said depositing a first polysilicon layer, wherein said annealing is performed in situ at a temperature approximately 300–600° C.

22. The process of claim 21, wherein said annealing comprises purging oxygen from said ambient.

23. The process of claim 7, wherein said second polysilicon layer is substantially nitrogen free.

24. The method of claim 19, wherein said second polysilicon layer is substantially nitrogen free.

* * * * *